United States Patent [19]

Ford

[11] 3,829,788

[45] Aug. 13, 1974

[54] ELECTRIC POWER AMPLIFICATION AT LOW FREQUENCIES

[75] Inventor: Robert E. Ford, Orlando, Fla.

[73] Assignee: The United States of America as represented by the Secretary of the Navy, Washington, D.C.

[22] Filed: Dec. 21, 1972

[21] Appl. No.: 317,324

[52] U.S. Cl. ................................ 330/10, 330/124 R
[51] Int. Cl. ................................ H03f 3/38
[58] Field of Search ......... 330/10; 329/166; 332/43, 332/44

[56] References Cited

UNITED STATES PATENTS

| | | | |
|---|---|---|---|
| 2,489,248 | 11/1949 | Abraham | 329/166 X |
| 3,099,801 | 7/1963 | Jorgensen | 330/10 |
| 3,348,151 | 10/1967 | Holmes | 325/185 |

OTHER PUBLICATIONS

Text–Modulation Theory by "Black"–1953 D. Van Nostrand Co., Inc.–pp. 162,163.

*Primary Examiner*—Nathan Kaufman
*Attorney, Agent, or Firm*—R. S. Sciascia; Arthur L. Branning

[57] ABSTRACT

A modulator-demodulator amplifier having high power gain at frequencies from D.C to 200 Hz. The low frequency signal to be amplified is full wave rectified (producing half cycles at twice the low frequency) and subsequently used to modulate a higher frequency signal which falls in the band pass of a conventional power amplifier. After amplification, the modulated signal is rectified so as to produce alternate positive and negative half cycles of the original low frequency. The signal is then fed to a low pass filter which retrieves the envelope of the modulated signal which constitutes an amplified version of the low frequency signal. This concept is also applicable to higher frequency amplification, i.e., radio and video frequency amplifiers, to extend their response to include the audio frequency range.

8 Claims, 4 Drawing Figures

ELECTRIC POWER AMPLIFICATION AT LOW FREQUENCIES

BACKGROUND OF THE INVENTION

The invention relates generally to power amplification of infrasonic electrical signals and more specifically to use of conventional power amplifiers in conjunction with modulation and demodulation techniques to produce this amplification. Prior systems for power amplification at low frequencies fall into three categories. Conventional power amplifiers, the first category, require large, expensive, and heavy components which have been somewhat ineffective and certainly impractical below 100 Hz. For example, the size, weight and cost of transformers used in conventional power amplifiers increases radically as their lower range of operation is extended. Similarly, the size of capacitors also increases greatly. Rotary devices, the second category, are effective only up to a few hertz. For example, the amplidyne is found to be effective at only a few cycles and its power capabilities decrease rapidly as the frequency is increased. The third category, comprising bipolar controlled direct current power supplies, has been effective only up to a few hundred watts.

SUMMARY OF THE INVENTION

The present invention solves the problems of the prior art by using the low frequency signal to modulate a higher frequency signal capable of amplification by smaller, more convenient, and less expensive amplifiers. The amplified higher frequency signal creates an envelope representative of the low frequency signal, Alternating intervals of positive and negative cycles of the modulated waveform are produced by two bridge rectifiers. Subsequent smoothing of the rectified wave in a low pass filter produces an amplified version of the original input low frequency signal. The invention can take the form of complete units or auxilliary equipment to be used in conjunction with conventional audio amplifiers. One advantage of the auxilliary equipment is that virtually any conventional audio power amplifier can be used without modification of its structure of change in its impedance matching characteristics. Where the invention is used as a complete amplifying system, it will provide a frequency range with high power capabilities not now poassible at the smaller size and weight and lower cost of the present invention.

OBJECTS OF THE INVENTION

It is therefore the purpose of this invention to solve the problems of the prior art systems by producing an inexpensive, convenient device for amplifying low frequency signals.

It is also the object of this device to extend the frequency operation of conventional power amplifiers and retain their impedance matching capabilities.

Other objects, advantages and novel features of the invention will become apparent from the following detailed description of the invention when considered in conjunction with the accompanying drawing:

DETAILED DESCRIPTION OF THE SPECIFIC EMBODIMENT

Figure 1:
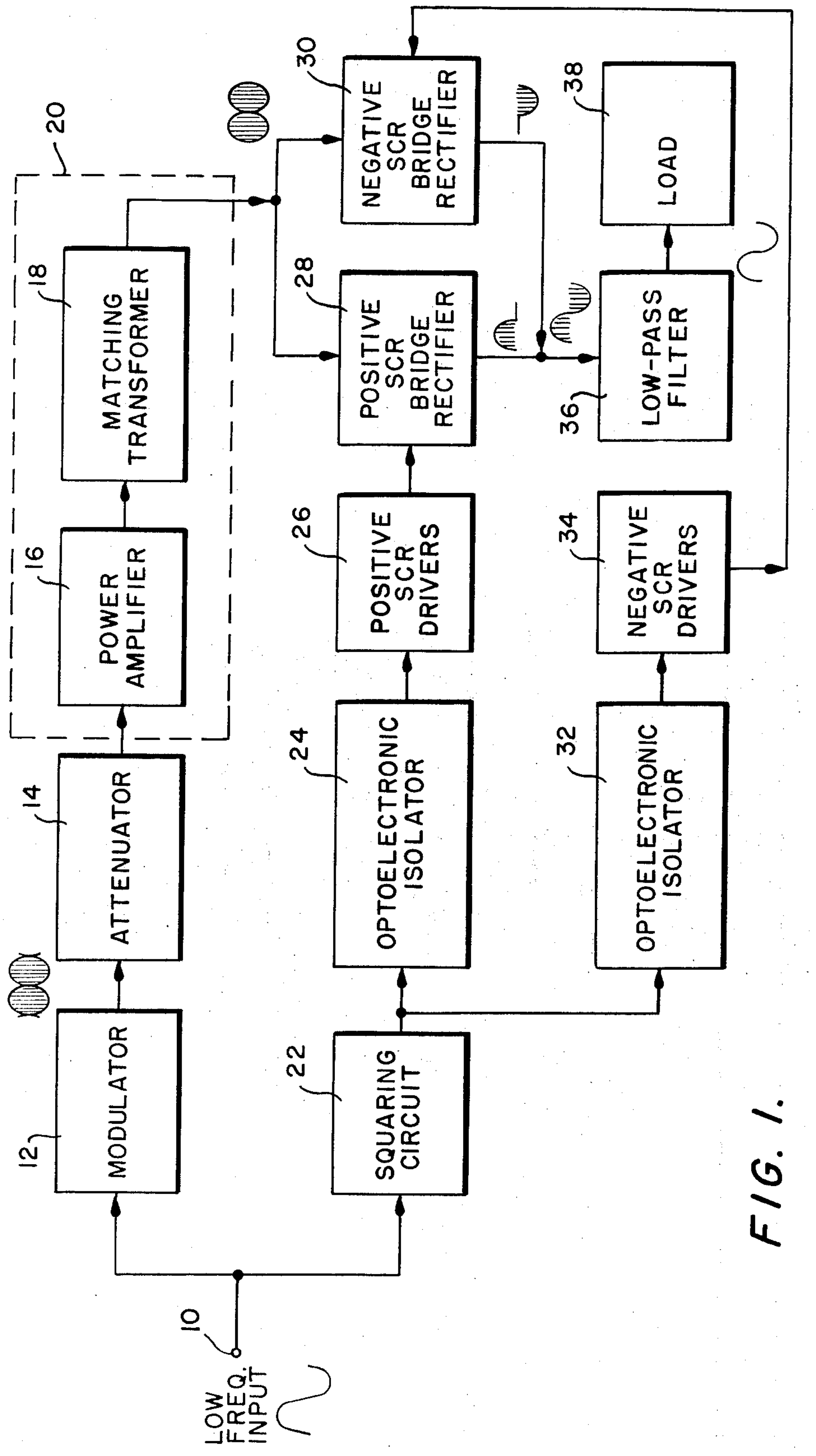
FIG. 1 shows a block diagram of one embodiment of the invention.
Figure 2:
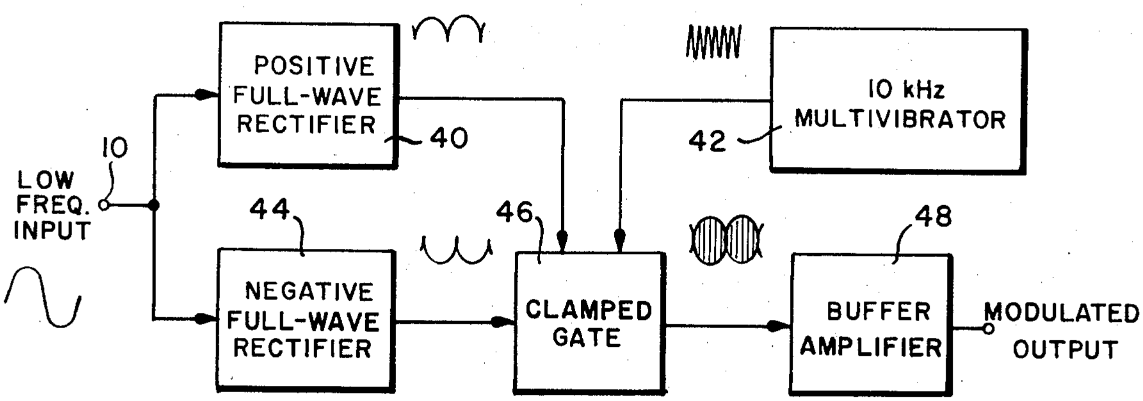
FIG. 2 shows one example of a modulator as shown in FIG. 1.

FIG. 1 is a block diagram of the preferred embodiment of the invention. The low frequency signal to be amplified is entered in the system at input 10. The signal is fed both to a modulator 12 and a squaring circuit 22. On example of a modulator for use in the embodiment of FIG. 1 is shown in FIG. 2. The modulator 12 both positively and negatively full wave rectifies the low frequency signals in rectifiers 40 and 44, respectively. These positive and negative, full wave rectified signals are combined and applied to the clamped gate 46 along with a 10kHz signal from multivibrator 42. The clamped 46 combines the signals such that the positive and negative full wave rectified signals amplitude modulate the 10 kHz multivibrator carrier signal. This is a well known method of modulation. The low frequency audio signal is used as the clamp voltage to control the magnitude of the input carrier. The resulting output is a 10 kHz signal which varies in amplitude such that the envelope formed matches the low frequency waveform such as shown at 54, FIG. 3. This modulated waveform is applied to an attenuator 14 as shown in FIG. 1 which prepares the signal for power amplification by matching impedances to the input of the power amplifier 16 and reducing the signal magnitude to a proper level for amplification.

A conventional audio power amplifier unit 20 can be used for amplification as shown in FIG. 1 since the carrier signal's frequency fall within the audio range. Included in the amplifying unit 20 is a power amplifier 16 and an output matching transformer 18. The power amplifier 20 can be either a presnetly existing unit with the remaining structure of FIG. 1 used as auxilliary plug in equipment or integrated into the structure of FIG. 1. This would radically extend the amplifier's low frequency response.

Figure 3:
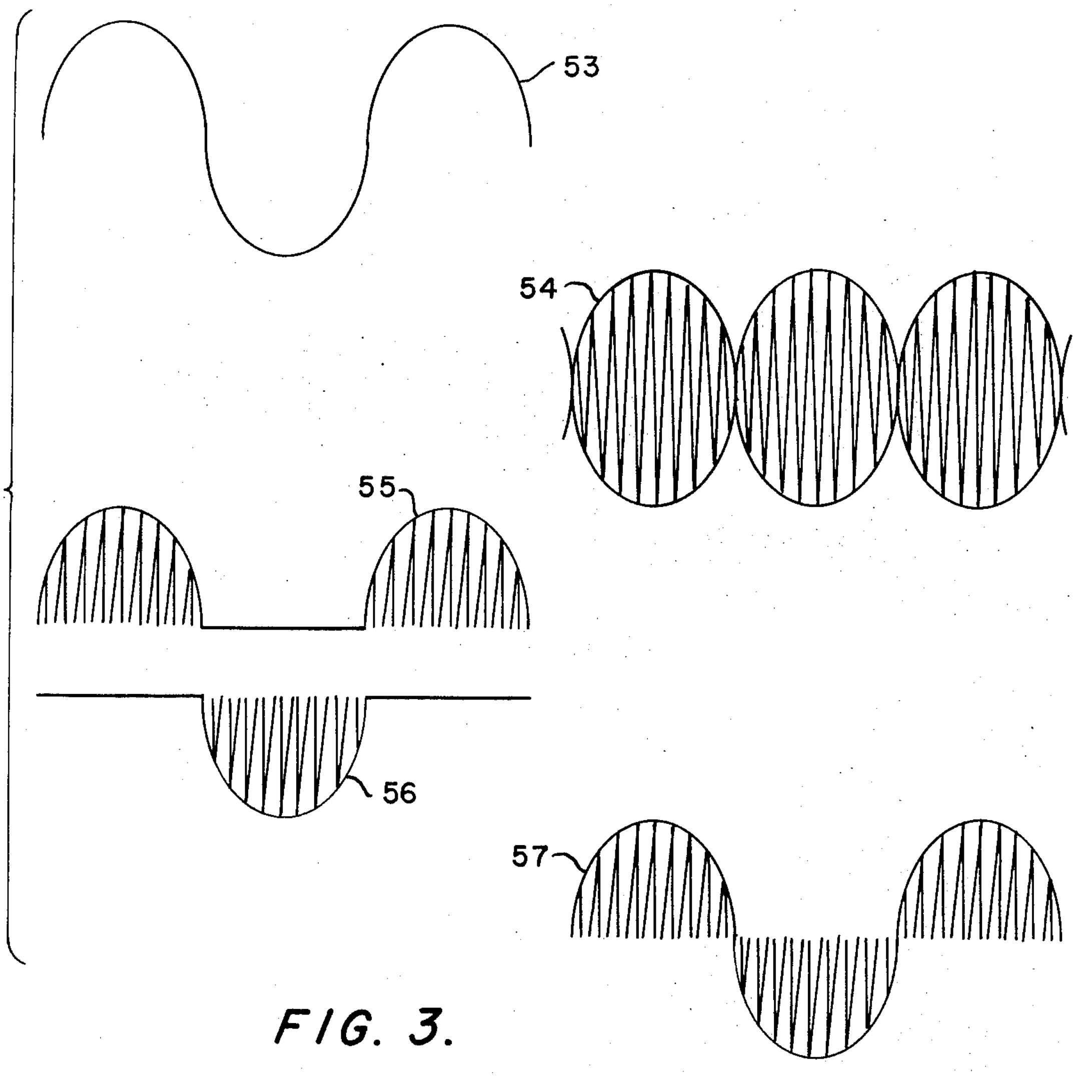
FIG. 3 shows a modulated and unmodulated waveform and alternating positive and negative half cycles of the modulated waveform.
Figure 4:
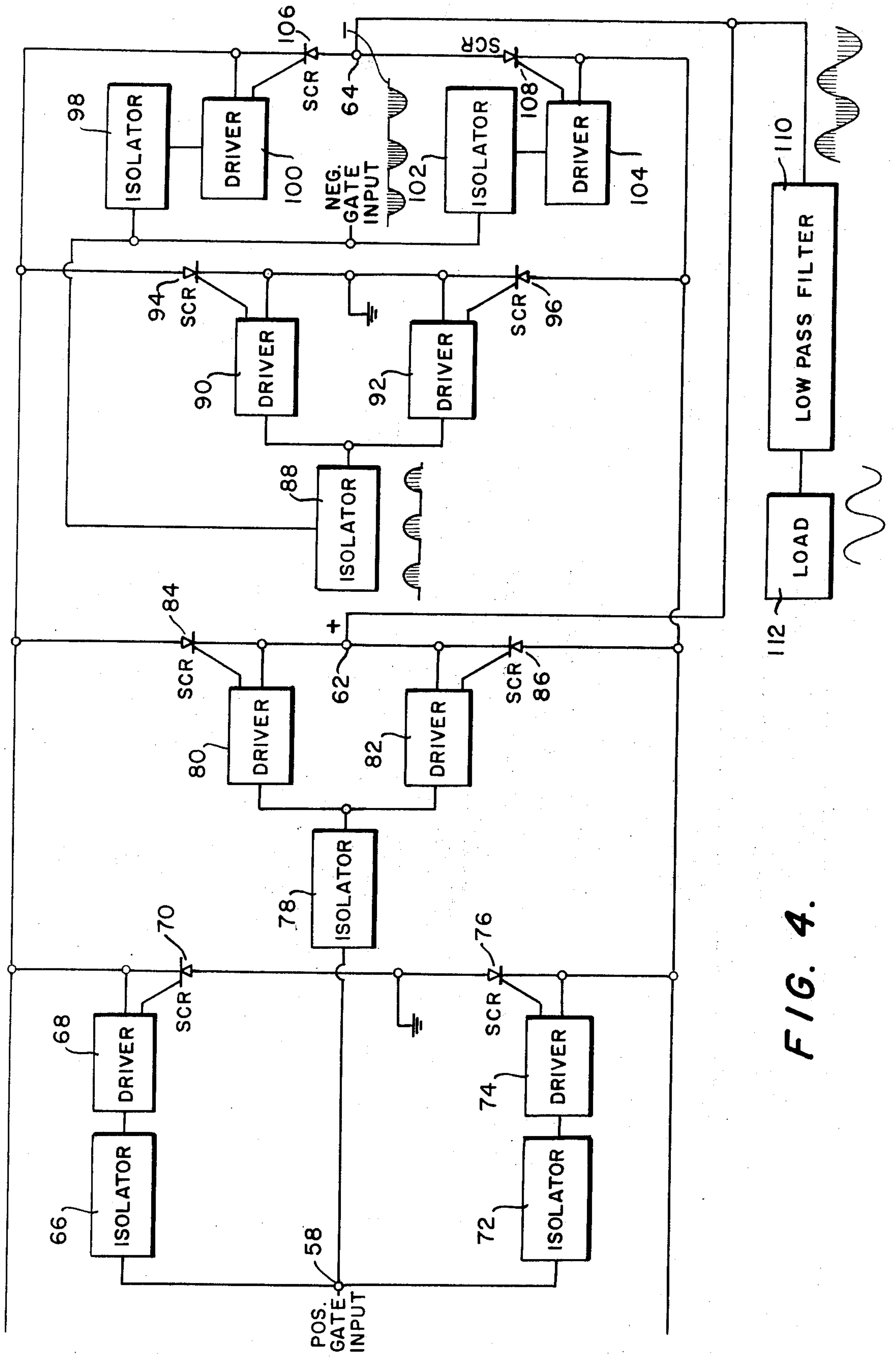
FIG. 4 shows an example of bridge rectifiers as shown in FIG. 1.

The amplified signal is then applied to positive SCR bridge rectifier 28 and negative SCR bridge rectifier 30 as shown in FIGS. 1 and 4. The function of the positive SCR bridge rectifier is to rectify every other interval of positive half cycles of the amplified waveform 54 as illustrated by waveform 55, FIG. 3. Similarly, the negative SCR bridge rectifier produces alternating intervals of negatively rectified cycles of the amplified modulated signal 54, illustrated by waveform 56, FIG. 3. The manner in which is is perfomed is shown in FIGS. 1 and 4.

In FIG. 1, as previously mentioned, the low frequency signal is also applied to a squaring circuit 22 which produces a square wave of the same period as the low frequency signal. This square wave is applied to a series of optoelectric isolators, diagrammatically shown in FIG. 1 as elements 24 and 32, which function as control units and impedance matchers for SCR drivers 26 and 34. Any suitable element for performing these functions could be used in place of the optoelectronic isolators. The function of the SCR drivers, diagrammatically shown in FIG. 1 as elements 26 and 34, is to produce a pulse to trigger on a series of silicon controlled rectifiers (SCR's) at the instant of polarity change in the square wave. Due to the arrangement of the SCR's this produces the desired alternating positively and negatively rectified output.

FIG. 4 shows in more detail the elements 24 to 38 of FIG. 1. Isolators 66, 78, 72, and 88, 98, 102 of FIG. 4 are encompassed in elements 24 and 32 of FIG. 1, respectively. Similarly, drivers 68, 74, 80, 82 and 90, 92, 100, 104 are encompassed in elements 26 and 34. SCR's 94, 96, 106 and 108 constitute the negative SCR bridge rectifier 30. SCR's 70, 76, 84, and 86 constitute the positive SCR bridge rectifier 26. The amplified modulated carrier signal inputs are shown as the top and bottom lines of FIG. 4.

The manner in which the desired output is produced by the bridge rectifiers is shown in FIG. 4. The positive SCR drivers produce a pulse when the square wave is changing from negative to positive polarity. Thus the SCR bridge acts as a conventional diode rectifier during every other half period of the square wave or low frequency wave. In fact any rectifier capable of producing these results could be used instead. By grounding the negative output of the bridge rectifier and using the positive output, the desired waveform 55 of FIG. 3 is produced. Similarly, negative SCR drivers produce pulses to trigger the negative SCR bridge rectifier when the square wave is stepping from positive to negative polarity. This triggers the SCR's to conduct on alternating half periods. Since the positive output of the negative SCR bridge is grounded, the negative output produces the waveform 56 of FIG. 3.

The waveforms 55 and 56 produced by bridge rectifiers 28 and 30 respectively, are combined at their output to produce waveform 57, FIG. 3. This waveform is applied to a low pass filter 36 to retrieve the envelope of the carrier waveform 53 which corresponds to an amplified version of the low frequency wave to be applied to a load 38 FIG. 1.

One advantage of the device is that it allows use of a higher frequency matching transformer requiring less size and expense and capable of matching differing loads to deliver maximum power.

In addition to being used to amplify infrasonic signals, the present device could be used to produce a wide-band high power audio amplifier of minimum size and weight by using a radio or video frequency carrier and amplifier where audio frequency signals would consitute the low frequency input.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A device for extending the low frequency response of a power amplifier comprising:
- means for providing a low frequency input signal;
- a first full wave rectifier connected to receive said input signal to provide a positive full wave rectified output;
- a second full wave rectifier connected to receive said input signal to provide a negative full wave rectified output;
- means for providing a carrier signal of a frequency greater than said input signal;
- means for combining the positive and negative full wave rectified outputs to amplitude modulate said carrier signal;
- means for power amplifying said modulated carrier signal at said carrier frequency;
- means for receiving and rectifying said amplified modulated carrier signal to produce alternating intervals of positive and negative half cycles of the same period as said input signal; and
- means for retreiving the envelope of said intervals of positive and negative half cycles, said evelope forming an amplified output signal of the same shape and frequency as said input signal.

2. The device of claim 1 wherein said means for rectifying, comprises:
- first SCR bridge means for producing output intervals of positive carrier half cycles for every other half cycle of the input signal frequency;
- second SCR bridge means for producing output intervals of negative carrier half cycles for every other half cycle of the input signal frequency; and
- means for combining the outputs of said first and second SCR bridge means to form said alternating intervals of positive and negative half cycles at said frequency.

3. The device of claim 1 wherein said means for rectifying comprises:
- means for producing a square wave alternating between positive and negative polarity and of the same period as the low frequency input signal;
- a first SCR bridge rectifier having a positive output terminal and a negative output terminal connected to ground;
- a second SCR bridge rectifier having a negative output terminal and a positive output terminal connected to ground;
- means for applying said amplified modulated signal to the inputs of said first and second SCR bridge rectifiers;
- means responsive to said square wave for triggering the SCR's of said first bridge to conduct upon a change of square wave polarity from negative to positive;
- means responsive to said square wave for triggering the SCR's of said second bridge to conduct upon a change of square wave polarity from positive to negative; and
- means for combining the positive output of said first bridge and the negative output of said second bridge to form said alternating intervals of positive and netative half cycles at said input frequency.

4. The device of claim 3 wherein said means for providing a low frequency input signal comprises a signal source of DC to 200 Hz, and wherein said means for producing a carrier signal comprises a 10kHz signal source.

5. The device of claim 2 wherein said means for retrieving comprises:
- filtering means for smoothing the modulated waveform to retrieve the envelope of said alternating intervals of positive and negative half cycles.

6. The device of claim 1 wherein said means for amplifying comprises an audio power amplifier.

7. The device of claim 1 wherein said means for amplifying comprises a radio frequency amplifier.

8. The device of claim 1 wherein said means for amplifying comprises a video frequency power amplifier.

* * * * *

PO-1050
(5/69)

UNITED STATES PATENT OFFICE
CERTIFICATE OF CORRECTION

Patent No. 3,829,788 Dated August 13, 1974

Inventor(s) Robert E. Ford

It is certified that error appears in the above-identified patent and that said Letters Patent are hereby corrected as shown below:

Column 1, line 33, change "," to -- . --;

line 34, after "negative" insert -- half --.

Column 2, line 51, after "rectified" insert -- half --.

Column 4, lines 59 and 60, change "waveform" to -- signal --.

Signed and sealed this 18th day of February 1975.

(SEAL)
Attest:

RUTH C. MASON
Attesting Officer

C. MARSHALL DANN
Commissioner of Patents
and Trademarks